United States Patent
Kubena et al.

(10) Patent No.: US 8,994,465 B1
(45) Date of Patent: Mar. 31, 2015

(54) PHASE NOISE REDUCTION CONTROL LOOP FOR OSCILLATORS USING NONLINEAR RESONATOR OPERATION

(71) Applicant: HRL Laboratories, LLC, Malibu, CA (US)

(72) Inventors: Randall L. Kubena, Oak Park, CA (US); Richard J. Joyce, Thousand Oaks, CA (US); Harris P. Moyer, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 71 days.

(21) Appl. No.: 13/742,250

(22) Filed: Jan. 15, 2013

Related U.S. Application Data (60) Provisional application No. 61/671,017, filed on Jul. 12, 2012.

(51) Int. Cl.
*H03B 5/32* (2006.01)
*H03L 7/00* (2006.01)
*H03B 5/36* (2006.01)
*H03B 5/10* (2006.01)

(52) U.S. Cl.
CPC .. *H03L 7/00* (2013.01); *H03B 5/36* (2013.01); *H03B 5/10* (2013.01)
USPC ............... 331/158; 331/116 R; 331/116 FE; 331/2; 331/46; 331/175

(58) Field of Classification Search
CPC ............... H03L 5/36; H03L 7/00; H03B 5/10
USPC ............... 331/158, 116 R, 116 FE, 2, 46, 175
See application file for complete search history.

(56) References Cited

U.S. PATENT DOCUMENTS

2004/0056728 A1* 3/2004 Dent et al. ............... 331/158

OTHER PUBLICATIONS

Yurke, et al., "Theory of amplifier-noise evasion in an oscillator employing a nonlinear resonator", The American Physical Society, Physical Review A, vol. 51, No. 5, pp. 4211-4229, May 1995.

\* cited by examiner

*Primary Examiner* — Arnold Kinkead
(74) *Attorney, Agent, or Firm* — Ladas & Parry (57) ABSTRACT

A method for reducing the phase noise of a oscillator includes monitoring a phase slope of a resonator, and controlling the resonator to operate the resonator at a high phase slope condition, wherein the resonator comprises a piezoelectric material, or piezoelectric quartz.

27 Claims, 8 Drawing Sheets

PHASE NOISE REDUCTION CONTROL LOOP FOR OSCILLATORS USING NONLINEAR RESONATOR OPERATION

CROSS REFERENCE TO RELATED APPLICATIONS

This application is related to and claims the benefit of U.S. Provisional Application No. 61/671,017, filed Jul. 12, 2012, which is incorporated herein as though set out in full.

STATEMENT REGARDING FEDERAL FUNDING

This invention was made under U.S. Government contract HR0011-10-C-0109. The U.S. Government has certain rights in this invention.

TECHNICAL FIELD

This disclosure relates to phase noise reduction and in particular to phase noise reduction for oscillators.

BACKGROUND

In the following background and description a distinction is made between a resonator and an oscillator. A resonator is generally a piezoelectric device that vibrates mechanically when stimulated by an electric signal. An oscillator comprises a resonator and ancillary components to supply the stimulus signal to the resonator.

Figure 1:
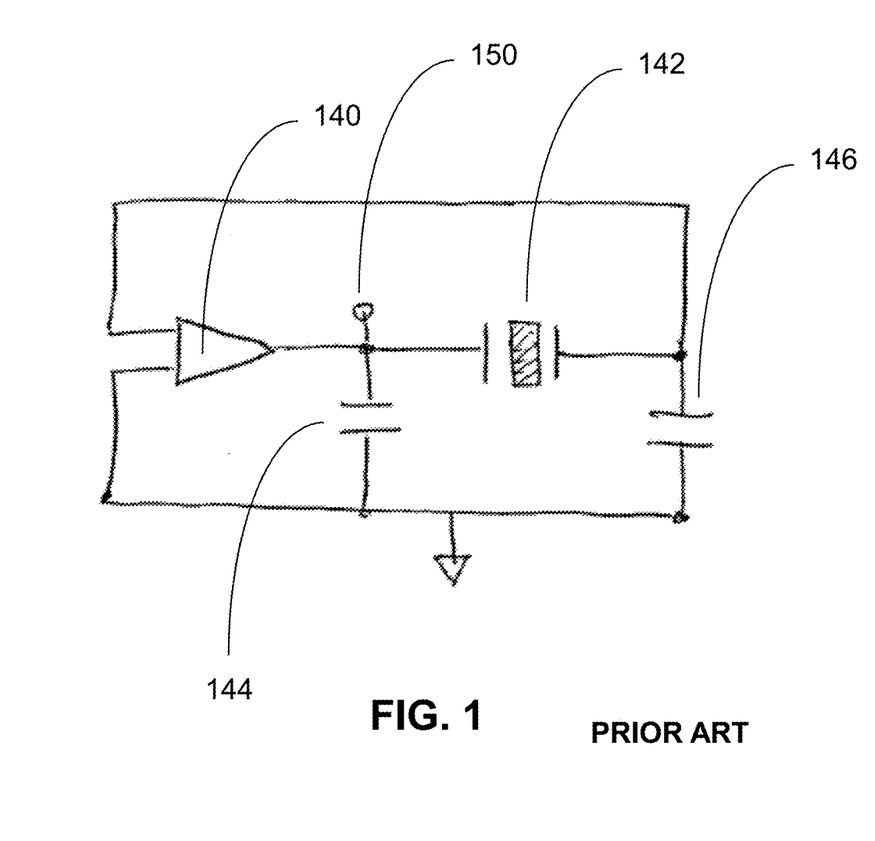
FIG. 1 shows a schematic of a classical Pierce oscillator circuit in accordance with the prior art.

In the prior art, sustaining circuits for mechanical oscillators typically control the operation of the resonator in its linear operating range. The drive levels used in the prior art are significantly low in order to prevent nonlinear elastic behavior of the resonator to prevent various instabilities from developing. For quartz and other piezoelectric oscillators, several sustaining circuits are currently widely used such as Pierce, Colpitts, and Clapp designs. These circuits consist of simple amplifiers and passive capacitive elements for providing static gain and phase control around the loop for overcoming resistive losses in the resonator and maintaining a $2\pi$ positive feedback. An example of a Pierce circuit is shown in FIG. 1. The Pierce circuit can be implemented with an amplifier 140, a crystal 142, and two capacitors 144 and 146, to produce the output 150.

More sophisticated circuits have been developed for temperature compensation using a microprocessor and look-up tables for determining the voltages to be applied to varactors within the loop for frequency pulling, such as a microcomputer compensated crystal oscillator (MCXO) designs. Other automatic gain control circuits have been developed to prevent the gain of the amplifiers from saturating and thus introducing extraneous noise at the output.

Because all current piezoelectric-resonator-based oscillators operate in the linear elastic regime of the resonator, the sustaining circuits that are currently being utilized only have simple gain stages and gain limiters for the amplifier within the control loop. None of these circuits are designed to work and stabilize the operating point around nonlinear features of the admittance curves of the resonators. In addition, there has been a long-felt belief that the lowest phase noise is obtained when an oscillator/resonator is run in the linear regime, because in many circuits nonlinearities typically produce extraneous noise through intermodulation distortions, mixing, and uncontrollable behavior.

B. Yurke, et al. in Physical Review A. Vol 51#5, 1995, pp 4211-4224 describe that for an oscillator using a silicon beam resonator the output noise of an amplifier in sustaining circuitry for an oscillator can contribute to the overall frequency noise (phase noise) of the oscillator, and that this electronic noise component of the total phase noise of the oscillator can be minimized by setting the operating point near or at the critical point of the resonator. Yurke further teaches that at this critical point, the slope of the phase shift across the resonator as a function of frequency approaches infinity, and that this high phase slope reduces the contribution of phase noise from the electronics from producing frequency or phase noise in the oscillator output. Further that a critical point may be produced by driving the amplitude of the resonator to a high enough level to produce a cubic functionality of the elastic constant.

What is needed is a apparatus and method for improved phase noise reduction using nonlinear characteristics of piezoelectric resonators. The embodiments of the present disclosure answer these and other needs.

SUMMARY

In a first embodiment disclosed herein, a method for reducing the phase noise of an oscillator comprises monitoring a phase slope of a resonator, and controlling the resonator to operate the resonator at a high phase slope condition, wherein the resonator comprises a piezoelectric material, or piezoelectric quartz.

In another embodiment disclosed herein, a circuit for reducing the phase noise of an oscillator comprises a resonator, a phase shifter coupled to the resonator for providing a DC phase operating point to the resonator, a phase ditherer coupled to the phase shifter for providing a phase dither to the phase shifter, an amplifier coupled to the phase shifter and to the resonator for providing an amplitude drive to the resonator, and a controller for controlling the phase dither and a frequency of the phase dither, and for adjusting the phase shifter and the amplitude drive based on the phase dither and a change in frequency of the oscillator due to the phase dither.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

One potential method which has been proposed for reducing the phase noise of an oscillator is to use the third order, also known as the duffing nonlinearity of the resonator, which produces a very sharp increase in the phase slope, or the phase shift versus frequency, across the resonator at the "critical point". This increase in phase slope mimics the same increase of phase slope which is observed as the Q of a mechanical resonator is increased. In order to produce this duffing behavior, the amplitude of the drive signal and the inherent Q of the resonator must both be high enough to strain the piezoelectric material of the resonator beyond its linear elastic limits. However, this places new and critical requirements on the oscillator's sustaining circuit to adjust for arbitrary resonators and to adjust both the amplitude and phase of the drive signal for positioning the operating point at or near the critical point. In addition, this positioning needs to occur at start-up, and also at various times during operation in case the environment or relaxation effects cause the critical point to move.

Figure 2:
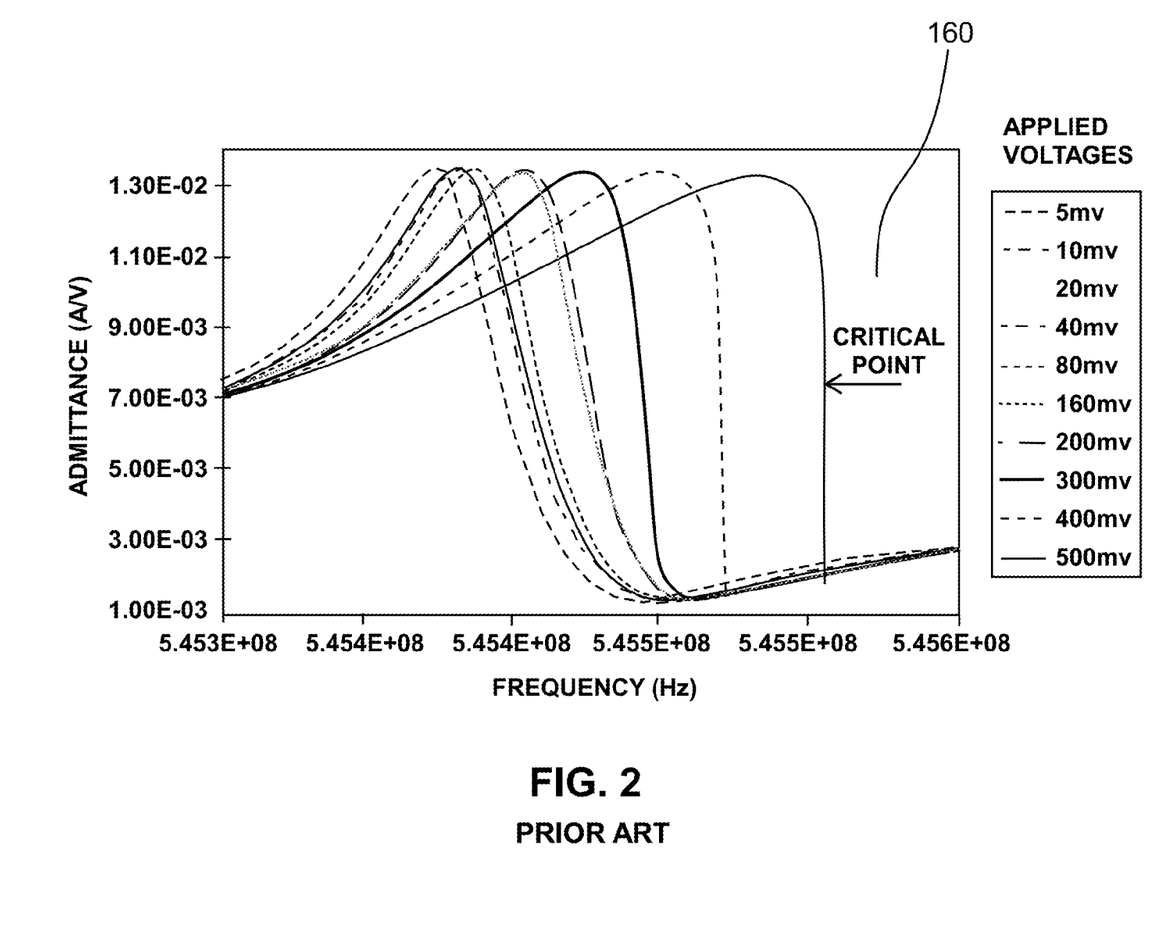
FIG. 2 shows the measured $3^{rd}$ order nonlinear admittance plot of an UHF quartz resonator in accordance with the prior art.

Operating an oscillator in the third order duffing nonlinear drive level of the resonator requires that the phase versus frequency slope of the resonator be determined within a closed loop and this information be used to actively control the amplitude and phase of the resonator at the operating point. Quartz UHF resonators have been known to have strong duffing nonlinearity characteristics as shown in FIG. 2. At critical point 160 the phase slope is very high, because the phase change across the resonator versus frequency is very high at that drive level. This characteristic can be used to optimize the "effective" Q of the resonator and therefore reduce the electronic component of the phase noise of the oscillator, because close-in phase noise has been shown to be proportional to $1/Q^2$ at a constant frequency.

In one embodiment to reduce phase noise, a phase dither or single frequency noise source is added within a classical control loop to modulate the frequency of output so that the phase slope can be calculated and then used for adjusting a drive amplitude and phase for the oscillator electronics. This phase dither may be applied at start-up and also at periodic times during operation for real-time adjustment. If the frequency of the phase dither is picked outside of the usual carrier offset bandwidth of interest, for example below 1 Hz, then the phase dither would not affect the operational performance. This allows a phase noise at one particular frequency to be added to the control loop in order to reduce the phase noise in the offset bandwidth of interest.

Figure 3:
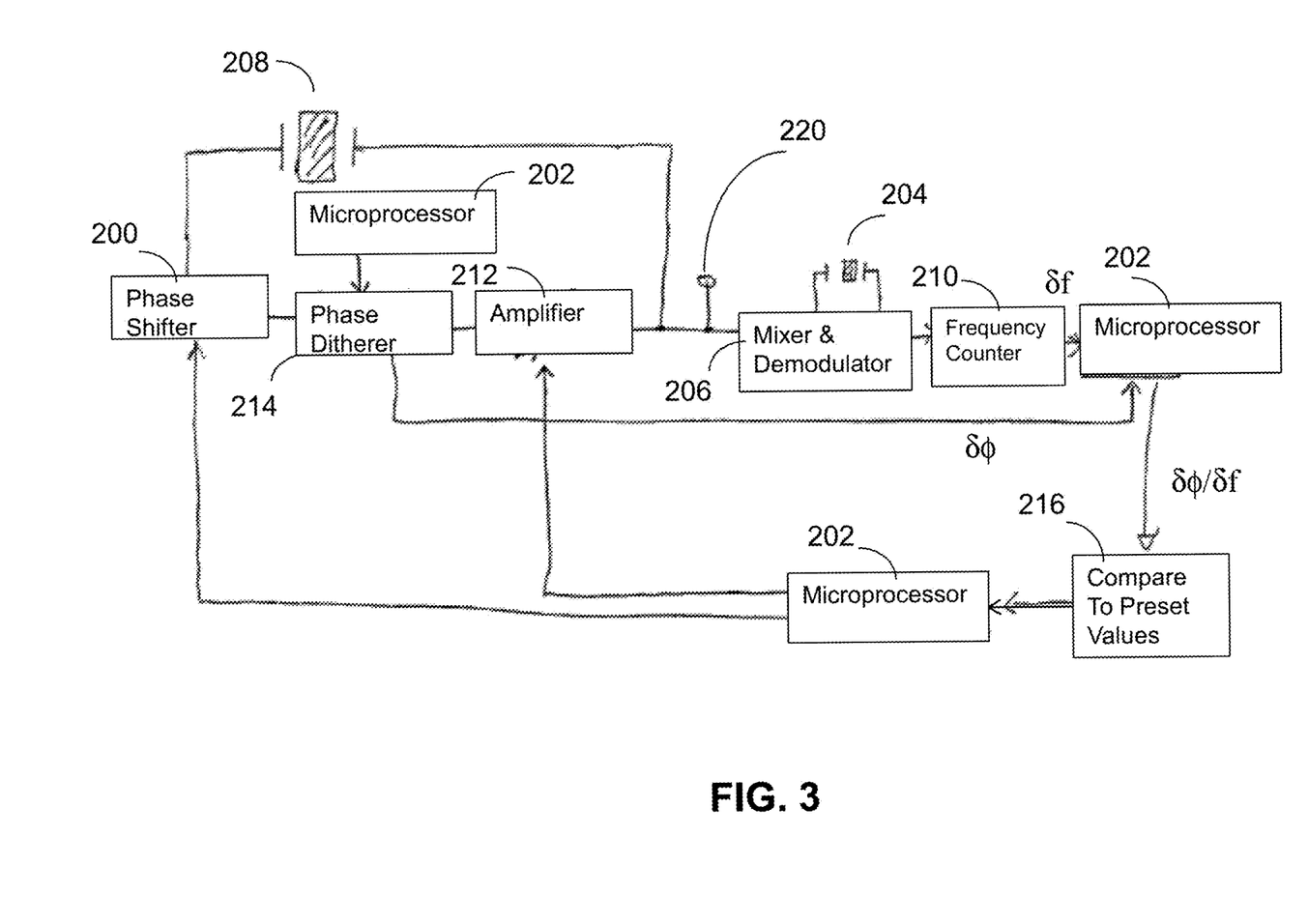
FIG. 3 is a block diagram of a circuit suitable for microintegration for phase noise reduction for oscillators using nonlinear resonator operation in accordance with the present disclosure.

One embodiment of this concept is shown in FIG. 3, which uses a microprocessor 202 to control the drive to resonator 208 in order to reduce the oscillator phase noise. Although three microprocessor 202 blocks are shown in FIG. 3, each microprocessor 202 in FIG. 3 may be the very same microprocessor.

Voltage-controlled phase shifter 200 and phase ditherer 214 may be used in series with other passive phase shifting elements (not shown), such as capacitors to dither the operating frequency of the resonator 208. The static phase across the resonator 208 is controlled by the phase shifter 200 that is controlled by a microprocessor 202. The microprocessor 202 also dithers the phase shift by controlling the phase ditherer 214. The phase from phase shifter 200 may be adjusted at start-up and at periodic times during operation. Dithering the phase by controlling phase ditherer 214 produces a change in the fundamental frequency of oscillation at the output 220 due to the phase versus frequency characteristic of the resonator 208.

A secondary matched clock 204 (VCO), which may be a crystal oscillator, may be used to drive a mixer and demodulator 206 to demodulate the output frequency 220 of the resonator 208. The matched clock 204 operates in the linear region at the same fundamental frequency as the resonator 208. The resonator 208 may be operating at a slowly varying ultra high frequency (UHF). The mixer-demodulator 206 essentially subtracts the fixed frequency of the matched clock 204 from the slowly varying fundamental frequency of the resonator 208 to produce a measure of the shift in frequency of the resonator 208 with time. The frequency shift of the resonator 208 produced by the phase dither 214 may be in the range of 10 kHz for a 500 MHz resonator 208 with an inherent Q of $10^4$. A frequency counter 210 can be used to measure the frequency shift of due to the phase dither 214 ($\delta\phi$), which is then supplied to the microprocessor 202.

It is desirable in this implementation of the frequency shift ($\delta f$) detection to closely match the frequency of the secondary matched clock 204 (VCO) to the operating frequency of resonator 208, so that the frequency shift produced by the phase shifter can be easily detected. In one preferred embodiment, the resonator for the secondary matched clock 204 may be piezoelectric material, moreover the secondary matched clock 204's resonator may be fabricated on the same piezoelectric substrate as the resonator 208 so that the two resonators track in frequency over temperature. In one preferred embodiment the resonator for the secondary matched clock 204 and the resonator 208 may be operated as UHF shear-mode devices. In another preferred embodiment the resonator 208 and secondary matched clock 204's resonator are co-located on the same piezoelectric quartz such that their respective resonant frequencies may be trimmed during manufacture to be within a few hundred parts per million of each other.

The microprocessor 202 uses the phase dither $\delta\phi$ and frequency shift $\delta f$ to calculate a phase slope $\delta\phi/\delta f$ and then compares this value to a preset value as shown in block 216. If the measured phase slope $\delta\phi/\delta f$ is smaller than a preset value, the microprocessor 202 varies the gain of the amplifier 212 and/or the phase shift in phase shifter 200 to increase the phase slope. Conversely, if the measured phase slope is greater than a preset value, the microprocessor 202 reduces the phase slope by varying the amplifier 212 gain and/or the phase shift in phase shifter 200 to decrease the phase slope. The algorithm for this optimization could consist of multiple iterations of adjusting the amplitude of amplifier 212 or the phase shift of phase shifter 200. The multiple iterations could take tens of seconds to complete, and may need to be repeated periodically throughout operation to adjust for changes in the environment or relaxation effects that cause the critical point to move.

Figure 4:
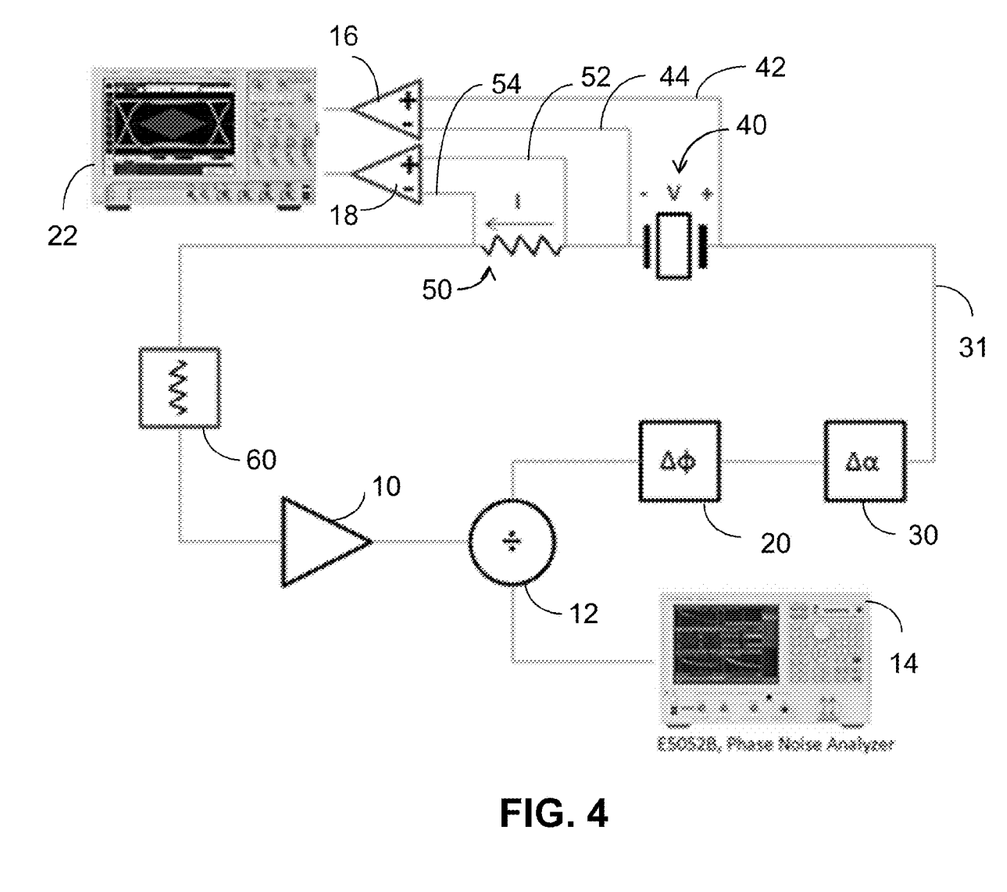
FIG. 4 is a block diagram of a laboratory demonstration of a oscillator circuit using nonlinear resonator operation for phase noise reduction and a phase noise analyzer for measuring the phase noise at various drive levels and phase conditions in accordance with the present disclosure.

A test circuit, shown in FIG. 4, has been constructed to show that the phase and amplitude drive for an oscillator can be used to control the oscillator to operate nonlinearly to reduce phase noise.

The components in the test circuit of FIG. 4 include a resonator 40, which may be a UHF MEMs resonator, a current sense resistor 50, which may be a 10 ohm resistor, a fixed impedance matching circuit 60, which may be a 3 dB attenuator, an amplifier 10, which may have a gain of 40 dB, a power splitter 12, a variable phase shifter 20, and a variable attenuator 30. The variable phase shifter 20 may be a voltage-controlled variable phase shifter, which is controlled by applying a voltage to the phase shifter 20.

The impedance matching circuit 60 reduces any unwanted signal reflections. Another method to reduce reflections is to place a pad attenuator between the sense resistor 50 and the amplifier 10. Any impedance mismatch may also be dealt with by designing the amplifier 10 to have the appropriate impedance match, which may allow eliminating the impedance match circuit 60 or a pad attenuator.

A high speed oscilloscope 22 is connected via high impedance differential probes and differential buffers 16 and 18 to measure the voltage across the resonator 40 and the current through the sense resistor 50. A phase noise analyzer 14 is connected to one output of power splitter 12, and is used to measure the phase noise of the loop.

Figure 5:
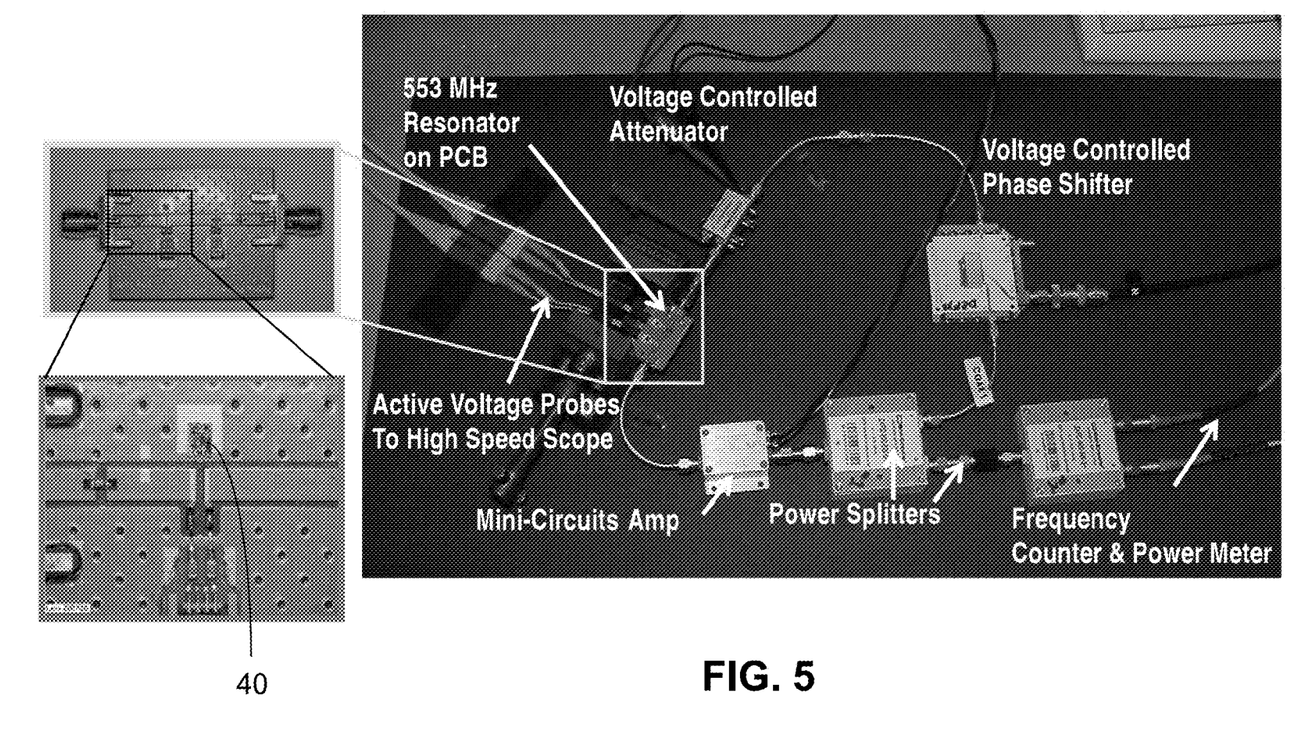
FIG. 5 is a photograph of the circuit implementation of FIG. 4 used to set the phase and amplitude of the signal across a UHF MEMS resonator running in a nonlinear regime and for measuring the admittance and phase noise in accordance with the present disclosure.

A photograph of an implementation of the circuit of FIG. 4 is shown in FIG. 5, along with close-up photos of the resonator 40 with a 10 ohm current sense resistor 50 on a printed circuit board with active probe sockets. The active voltage probes shown in FIG. 5 enable real time current and voltage measurements across the resonator 40 to determine its admittance amplitude and phase during oscillator operation.

Although the circuit of FIG. 4 does not implement the phase dither and phase slope ($\delta\phi/\delta f$) detection as discussed above in relation to the circuit of FIG. 3, the circuit of FIG. 4 has been used to demonstrate that the amplitude and phase within a UHF MEMS-based oscillator can be controlled to allow operation at any arbitrary phase slope.

The circuit of FIG. 4 may be used to calibrate the maximum phase slope of an oscillator such as shown in FIG. 3, and once the maximum phase slope of an resonator 208 in FIG. 3 is determined, then the oscillator can be embedded in a circuit similar to that shown in FIG. 3 and its nonlinear operation controlled. The preset values referred to in relation to the compare to preset values block 216 may also be determined through calibration.

In the circuit of FIG. 4, the phase and admittance across the resonator 40 can be determined by measuring the voltage across the resonator 40 and current through the resonator by measuring the current through resistor 50. To observe these without disturbing the circuit performance, differential buffers 16 and 18 are connected to low parasitic capacitance probes 42 and 44, and 52 and 54. The outputs of the buffers 16 and 18 are connected to the high speed oscilloscope 22 to observe the admittance.

Figure 7:
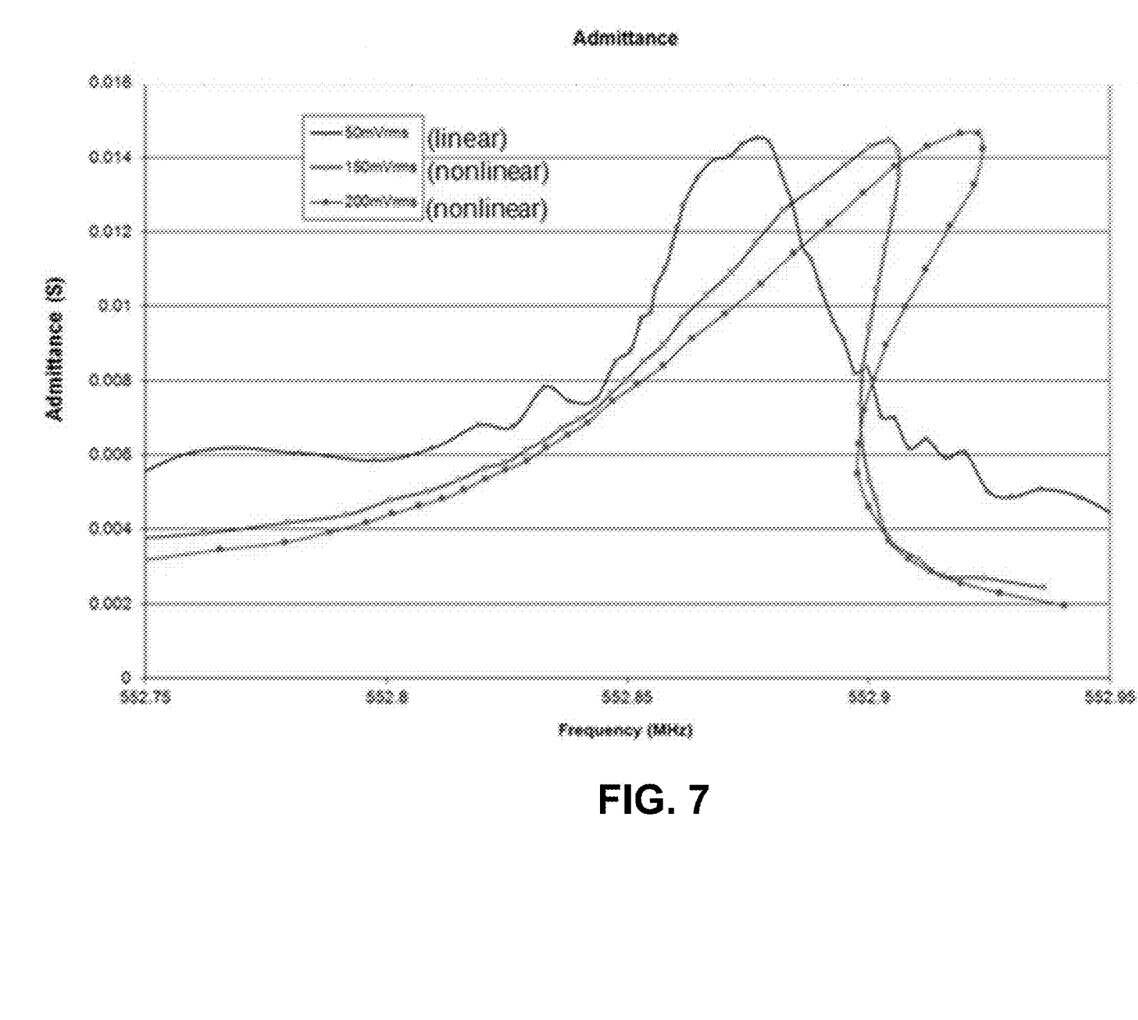
FIG. 7 shows a plot of the admittance of a resonator at various drive levels in which each point represents an operating point based on the setting of a variable phase shifter in accordance with the present disclosure.
Figure 8:
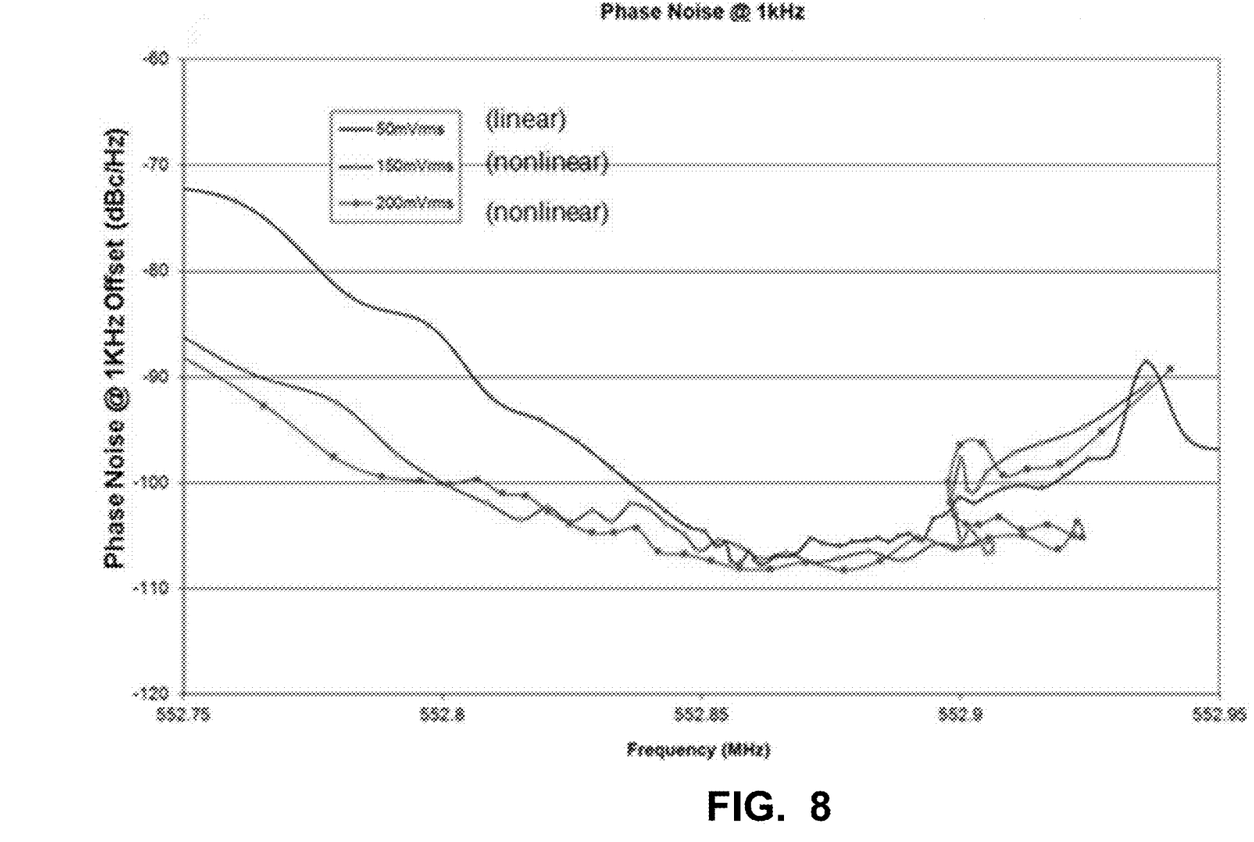
FIG. 8 shows a plot of phase noise at 1 kHz offset at each carrier frequency or phase across the resonator for the operation at several drive levels shown in accordance with the present disclosure.

The phase noise of a UHF MEMS-based oscillator 40 in the circuit of FIG. 4 was measured with phase noise analyzer 14 for various drive levels and phase settings for the resonator 40. The results are shown in FIG. 8 for various drive levels and points on the admittance curves as shown in FIG. 7. In FIG. 7, the admittance was determined at each drive level as described above for different settings of the phase shifter 20 in FIG. 4.

In FIG. 8 each point represents a resonator 40 operating point or closed loop operating condition based on the setting of the variable phase shifter 20 in FIG. 4, and shows that regions of lower phase noise can be identified and the operation of the resonator 40 can be controlled at these regions. FIG. 8 shows that a drop in the phase noise of the resonator 40 is observed in a range of nonlinear operating points for drive levels of 150 mV and 200 mV compared to that seen for a lower drive level of 50 mV for a linear operating point.

Further, as shown in FIG. 8, the lowest phase noise is at a frequency of about 552.853 MHz. Referring to FIG. 7 it can be seen that a frequency of about 552.853 MHz is lower than the frequency at which the admittance, which is a indicator of phase slope, is at a peak. This is different than the teachings of Yurke, discussed above. Yurke teaches to operate the resonator at special points on the resonance curve where the phase slope approaches infinity. The results shown in FIGS. 7 and 8 show that a low phase noise may be obtained at frequencies where the phase slope is not approaching infinity.

Figure 6:
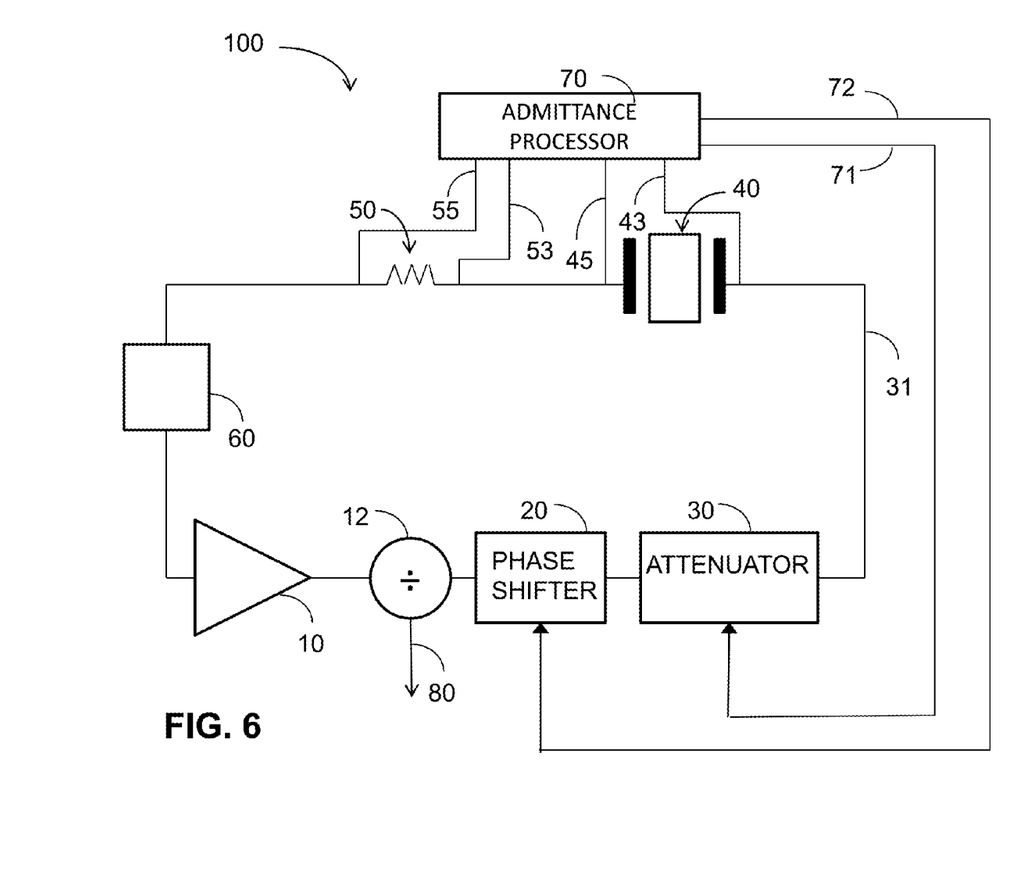
FIG. 6 shows an apparatus having a phase noise reduction control loop for reducing phase noise in an oscillator circuit using nonlinear resonator operation in accordance with the present disclosure.

Referring now to FIG. 6, another oscillator 100 designed to operate a resonator 40 in its nonlinear regime and to reduce the phase noise in the resonator 40 is shown. The oscillator 100 has an amplifier 10 that provides a drive signal to a voltage variable phase shifter 20. The output of the variable phase shifter 20, which provides phase modulation of the drive for the resonator 40, is connected to voltage variable attenuator 30, which provides amplitude modulation of the drive for the resonator 40. The phase of the resonator 40 is monitored by an admittance processor 70 via very low parasitic differential buffer electronics connected across the resonator 40 at points 43 and 45. The very low parasitic differential buffer electronics minimize any loading placed on the resonator 40, similar to the low parasitic capacitance probes 42 and 44 connected to the differential buffer 16 in FIG. 4.

The output current of the resonator 40 passes through a resistor 50, which may also be monitored by the admittance processor 70 via very low parasitic differential buffer electronics connected across the resistor 50 at points 53 and 55. The very low parasitic differential buffer electronics minimize any loading placed on the resistor 50, similar to the low parasitic capacitance probes 52 and 54 connected across resistor 50 in FIG. 4. The resistor 50 may have a low value, such as 10 ohms, to sense the current through the resistor 50. The control loop of the oscillator 100 is closed with an impedance match circuit 60, connected to amplifier 10, which may be connected to a power splitter 12.

The admittance processor 70 may be a commercially available admittance measurement tool or a high speed oscilloscope where a user supplies the adjusting signals 72 and 71.

The admittance processor 70 may operate in an open loop calibration mode to determine the phase shift through the resonator 40. Then in normal operation, and not to imply a limitation, the phase shift as a function of frequency and voltage across the resonator 40 may be retrieved to control the attenuator 30 and phase shifter 20.

The admittance processor 70 processes the measured phase of the voltage across the resonator 40 with respect to the current through resistor 50, and provides adjusting signals 72 and 71 to control the variable phase shifter 20 and the variable attenuator 30, respectively, such that the oscillator 100 operates the resonator 40 in the non-linear region.

The impedance match circuit 60 preferably provides 3 dB of attenuation as well as providing approximately 50 ohms of impedance looking back from the amplifier 10. The impedance match circuit 60 may implemented with a Pi circuit, which is well-known to those skilled in the art, and has the purpose of matching the impedance to minimize any reflections, which would lead to poor admittance measurements.

The current sense resistor 50 is preferably sized to be about 10% the value of the series resistance of the resonator 40.

In operation, the admittance processor 70 adjusts the phase shifter 20 and the variable attenuator 30 to operate the resonator 40 where the slope of the phase shift of the resonator 40 with respect to frequency is at or near a maximum.

Depending on the components used, the adjusting signal 72 may control the variable phase shifter 20, so that, as the adjusting signal 72 voltage goes more positive, the amount of phase shift also increases. The adjusting signal 71 may also control the variable attenuator 30, so that, as the adjusting signal 71 voltage goes more positive, the amount of attenuation decreases.

The output 80 of this circuit may be picked off from power splitter 12 and connected to other circuitry. The power splitter 12 placed at the output of amplifier 10, as shown in FIG. 6.

All components need to be carefully chosen and have properties of minimal noise and maximum temperature stability, among other performance characteristics. Key components include the low parasitic probes and the active differential buffers 16 and 18 in FIG. 4, and the corresponding very low parasitic differential buffer electronics connected to admittance processor 70 in FIG. 6. Without them, the circuit would be disturbed so much that the oscillator operation would not be able to be controlled properly. The parasitic values of the probe components and the differential buffer electronics need to be such that they have very minimal impact on the measured values of the resonator 40.

As a person skilled in the art would understand, alternative embodiments of the circuit 100 shown in FIGS. 3 and 4 may combine various components, such as, for example, combining the impedance match circuit 60 with the amplifier 10. Also instead of having a variable attenuator 30, a variable amplifier may be used, because either one can vary the amplitude drive for the resonator.

In accordance with the above description, circuits have been described to control and operate a resonator in its nonlinear regime. Such nonlinear operation of a resonator can be accomplished by periodic or real-time monitoring of the resonator's phase slope to determine its nonlinear operating point and then controlling the phase and amplitude drive for the resonator to maintain a nonlinear operating point for the resonator.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method for reducing the phase noise of an oscillator comprising:
    monitoring a phase slope of a resonator; and
    controlling the resonator to operate the resonator at a high phase slope condition;
    controlling a phase and amplitude drive for the resonator such that an admittance of the resonator has a slope of phase angle versus frequency that approaches infinity near a nonlinear critical point;
    adding a phase dither to the phase and amplitude drive for the resonator in order to change an operating frequency of the oscillator; and
    determining the slope of the phase angle versus frequency from the phase dither and the change in the operating frequency of the oscillator.

2. The method of claim 1, wherein controlling the resonator to operate the resonator at a high phase slope condition comprises:
    controlling the resonator to operate with a $3^{rd}$ order elastic nonlinearity.

3. The method of claim 1 further comprising:
    adjusting the phase and amplitude drive for the resonator using the slope of the admittance phase angle versus frequency so as to set the operating frequency of the oscillator near the critical point of the resonator.

4. The method of claim 1 further comprising:
    determining the change in the operating frequency of the oscillator by using a frequency counter.

5. The method of claim 4 further comprising:
    mixing and demodulating the operating frequency of the resonator in order to reduce the frequency precision of the frequency counter;
    wherein a secondary oscillator is used for the mixing.

6. The method of claim 5, wherein a frequency of the secondary oscillator is closely matched to the operating frequency for the oscillator.

7. The method of claim 6, wherein the frequency of the secondary oscillator is matched to within several parts per million (ppm) to the operating frequency for the oscillator.

8. The method of claim 6, wherein the frequency of the secondary oscillator is matched using voltage-controlled oscillator (VCO) operation to the operating frequency for the oscillator.

9. The method of claim 1 wherein controlling the resonator to operate the resonator at a high phase slope condition comprises:

controlling a phase and amplitude drive for the resonator such that the admittance of the oscillator is less than a peak admittance, or controlling a phase and amplitude drive for the resonator such that the phase slope is not approaching infinity.

10. The method of claim 7 comprising:

fabricating a secondary resonator for the secondary oscillator on a same piezoelectric material or piezoelectric quartz as the resonator for the oscillator.

11. The method of claim 7 comprising:

fabricating a secondary resonator for the secondary oscillator on a same piezoelectric quartz plate as the resonator for the oscillator to maintain frequency matching over temperature.

12. The method of claim 1 wherein the resonator comprises a shear-mode device, or a UHF shear-mode device.

13. The method of claim 3, wherein adjusting the phase and amplitude drive for the resonator comprises adjusting the phase and amplitude drive for the resonator at resonator start-up, and/or adjusting the phase and amplitude drive for the resonator periodically after resonator start-up.

14. The method of claim 1, wherein adding a phase dither to the phase drive for the resonator to change an operating frequency of the oscillator comprises adding a phase dither that has a frequency which is outside a carrier offset frequency bandwidth of interest.

15. The method of claim 1, wherein monitoring a phase slope of the resonator comprises measuring a phase of the resonator and a current through the resonator.

16. The method of claim 15 further comprising:

controlling a variable phase shifter for providing a phase drive to the resonator;

controlling a variable attenuator coupled to the phase shifter and to the resonator for providing an amplitude drive to the resonator;

sensing current through a resistor to sense current through the resonator; and measuring the phase of the resonator and processing the measured phase and sensed current through the resonator to control the phase shifter and the amplitude drive to the resonator.

17. A circuit for reducing the phase noise of an oscillator comprising:

a resonator;

a phase shifter coupled to the resonator for providing a phase drive and DC phase operating point to the resonator;

a phase ditherer coupled to the phase shifter for providing a phase dither to the phase shifter;

an amplifier coupled to the phase shifter and to the resonator for providing an amplitude drive to the resonator; and a controller for controlling the phase dither and a frequency of the phase dither, and for adjusting the phase drive and the amplitude drive based on the phase dither and a change in frequency of the oscillator due to the phase dither.

18. The circuit of claim 17, wherein the controller controls the phase and amplitude drive for the resonator so that the resonator operates with a $3^{rd}$ order elastic nonlinearity.

19. The circuit of claim 17 wherein the controller controls a phase and amplitude drive for the resonator such that the resonator has a slope of phase angle versus frequency that approaches infinity near a critical point.

20. The circuit of claim 17 further comprising:

a mixer and a demodulator coupled to the amplifier drive to mix down an operating frequency of the resonator;

a secondary resonator coupled to the mixer and the demodulator; and a frequency counter coupled to the mixer and the demodulator for determining a frequency shift of the oscillator.

21. The circuit of claim 20 wherein a frequency of the secondary resonator is matched to within several hundred parts per million (ppm) to the operating frequency for the oscillator.

22. The circuit of claim 17 wherein the resonator comprises a piezoelectric material, or piezoelectric quartz.

23. The circuit of claim 17 wherein the resonator comprises a shear-mode device, or a UHF shear-mode device.

24. The circuit of claim 17 wherein the controller controls the phase and amplitude drive for the resonator at resonator start-up and periodically after resonator start-up.

25. The circuit of claim 17, wherein the controller controls the frequency of the phase dither to be outside a carrier offset frequency bandwidth of interest.

26. The circuit of claim 17, wherein the controller compares a slope of the phase dither and a change in frequency of the resonator due to the phase dither to a preset value for adjusting the phase drive and the amplitude drive of the resonator.

27. The method of claim 1 wherein the resonator comprises a piezoelectric material, or piezoelectric quartz.

* * * * *